United States Patent [19]

Sullivan

[11] Patent Number: 4,618,567

[45] Date of Patent: Oct. 21, 1986

[54] HIGH RESOLUTION LIQUID PHOTOPOLYMER COATING PATTERNS OVER IRREGULAR PRINTED WIRING BOARD SURFACE CONDUCTORS

[76] Inventor: Donald F. Sullivan, 115 Cambridge Rd., King of Prussia, Pa. 19406

[21] Appl. No.: 690,998

[22] Filed: Jan. 14, 1985

[51] Int. Cl.[4] .......... G03C 5/00

[52] U.S. Cl. .......... 430/311; 430/319; 430/325; 430/394

[58] Field of Search .......... 430/311, 319, 325, 394

[56] References Cited

U.S. PATENT DOCUMENTS

| | | | |
|---|---|---|---|
| 4,260,675 | 4/1981 | Sullivan | 430/315 |
| 4,424,089 | 1/1984 | Sullivan | 156/155 |
| 4,436,806 | 3/1984 | Rendulic et al. | 430/311 |
| 4,528,261 | 7/1985 | Hauser | 430/322 |

OTHER PUBLICATIONS

DeForest, *Photoresist: Materials and Processes,* McGraw-Hill, New York, 1975.

*Primary Examiner*—John E. Kittle
*Assistant Examiner*—José G. Dees
*Attorney, Agent, or Firm*—Laurence R. Brown

[57] ABSTRACT

High resolution photoimaging with liquid photopolymers of pastelike consistency overlying irregular surface topography such as provided by conductors extending from the surface of a printed wiring board substrate is obtained without air entrapment or starvation of the superimposed liquid polymer. Thus, for example, solder mask coatings of high resolution may be prepared. This is achieved in two photosteps, the first of which is a partial polymerization obtained by radiating with the polymer surface exposed to air, thereby polymerizing the layer portion unexposed to air adjacent the substrate surface and leaving the air exposed surface in the liquid state. This step uses an image with a greater dimension of opaque pattern area than that used in the subsequent step, which obtains high resolution by surface contact of the image with the polymer. The radiation source in each case is non-collimated. The resulting product because of the partial polymerization covering the surface produces no starvation over the rough surface because of pressing the second image into surface contact. The liquid polymer layer covers rough surfaces without entrapment of air. By radiating when the surface is exposed to air, noise causing poor resolution is eliminated, such as from surface interface reflections and pinholes in opaque surfaces, etc. A layer of liquid photopolymer is disposed upon its permanent substrate cured through only part of its thickness adjacent the substrate to leave a liquid tacky outer surface.

12 Claims, 4 Drawing Figures

NON-COLLIMATED RADIATION

HIGH RESOLUTION LIQUID PHOTOPOLYMER COATING PATTERNS OVER IRREGULAR PRINTED WIRING BOARD SURFACE CONDUCTORS

TECHNICAL FIELD

This invention relates to liquid photopolymer coatings on printed wiring boards, and more particularly it relates to method for assuring sufficient thickness of the polymer coatings over irregular surfaces with high resolution photo pattern reproduction on liquid polymers of pastelike consistency, and the products so obtained.

BACKGROUND ART

Liquid photopolymers of paste like consistency are in use for photopatterning coatings on printed wiring boards as evidenced by my U.S. Pat. No. 4,424,089, Jan. 3, 1984 for Photoprinting Process and Apparatus for Exposing Pasteconsistency Photopolymers. In that art the photopattern image bearing surface is pressed into contact with the polymer to produce high resolution coating patterns with non-collimated radiation of low intensity permissible because the polymer does not have its outer surface exposed to air. It is important to keep heat down and photospeed up in this manner.

Liquid polymers are imaged in U.S. Pat. No. 4,436,806, F. J. Rendulic, et al., Mar. 13, 1984 with the outer surface exposed to air thus requiring greater exposure energy and generating considerable heat. Furthermore to obtain high resolution coating patterns, collimated radiation is required to eliminate the noise from scattering at the interfaces and particularly from the air gap interface.

When the liquid polymer layers are superimposed over irregular surfaces, such as those encountered on printed wiring boards having conductor traces extending about 0.001 inch above the substrate surface, they have the significant advantage of covering the rough surface without entrapment of air, which would lower resolution and adversely affect curing and adhesion.

However when the phototool with image, generally a flexible film layer, is pressed into place into intimate air free contact with the liquid polymer layer superimposed over the wiring traces, then the liquid polymer tends to be displaced from the wiring traces and thinned or starved. Thus, the following photopatterning step will leave a deficient thickness of covering over the wiring traces. When solder masking is required, for example, a layer of substantial thickness is required over the conductors for proper adhesion, insulation and resistance to the heat and stresses of soldering. This problem is addressed by this invention.

Another problem introduced by the use of non-collimated radiation is the inconsistency with high resolution patterns. Thus surface interfaces, such as between a liquid polymer layer and a plastic film carrying the desired image pattern, can cause reflections of the radiant energy which introduces noise tending to polymerize the polymer in unwanted places. Thus in printed wiring boards undercutting may occur to cause reduced adhesion, short circuits, open circuits or the like. This has been resolved by using collimated radiation for photoexposure, which is expensive.

It is therefore a general object of this invention to resolve the problems of the prior art as set forth hereinbefore ato obtain high resolution photopatterning of liquid polymers using uncollimated radiation.

It is a further object of the invention to provide a method of producing superior products with high resolution photoimaged patterns produced with liquid photopolymers, with low photo energy and resulting heat while resolving problems of flow of the liquid polymer off of roughly contoured surface peaks, such as produced by conductor traces superimposed on the surface of a printed wiring board substrate.

Another general object of the invention is to produce a cured polymer layer in its permanent substrate position which has a tacky surface for further processing.

DISCLOSURE OF THE INVENTION

This invention resolves the inconsistent properties and photoresponse characteristics presented when it is desired to use inexpensive liquid photopolymers and inexpensive noncollimated radiation of low energy level to produce high resolution photopatterns with assurance of adequate thickness of the liquid photopolymer superimposed on conductor traces or other surfaces protruding from the substrate surface of a printed wiring board, even when a phototool image is pressed into air excluding intimate contact with the liquid polymer.

The property of the liquid photopolymers that polymerization is inhibited by air is employed in this invention to reduce stray noise effects from uncollimated radiation, so that high resolution images may be produced. Thus, considerably greater radiant energy is required to polymerize the liquid polymer when the surface is exposed to air. However this is inconsistent with the high resolution desired, where surface contact of the phototool carrying the image to be reproduced is required. To resolve this inconsistency the photopatterning process takes place partially with the phototool in surface contact and partly with the phototool separated by an air gap from the surface of the liquid polymer.

In a first embodiment two sequential photopolymerization steps respectively are made through separate photo images, with an air exposed polymer surface in the first step and the image in contact with the polymer surface in the second step. The first and second images are related by having the opaque portions of different areas. The first photo step with the air gap is then taken with the larger area opaque pattern image with enough radiant energy to polymerize only the portion of the polymer layer thickness adjacent the substrate carrying the layer and therefore not exposed to air. This substrate, typically a printed wiring board with superimposed wiring traces extending from the substrate surface, then has the polymer layer polymerized to a depth covering the wiring traces with sufficient thickness, typically 0.001 inch, to assure a good solder mask coat for example. Then a liquid unpolymerized outer surface layer permits the intimate air free lamination of the second image into surface contact, so that about the same amount of radiation energy will polymerize the polymer layer throughout its depth. Therefore with the final imaging step through the desired pattern with less opaque image area the high resolution final image is prepared. The liquid polymer in all cases has pastelike consistency when laid down and merged with the image carrying phototool by squeegee pressure as taught in my U.S. Pat. No. 4,424,089. The advantage of this embodiment is the assurance that the squeegee pressure does not displace or starve the liquid polymer layer over the edges of the wiring traces, but rather assures a minimum acceptable thickness of polymerized polymer over such surface irregularities.

In a second embodiment the partial surface contact is achieved with a contoured phototool surface with the transparent portions of the image in surface contact with the polymer and the opaque portions separated by an air gap from the polymer surface. Thus any stray radiation resulting from the non-collimated source at those areas where polymerization is not wanted is inhibited by the air-inhibiting characteristic of the polymer. This has the advantage of a single radiating step and a single phototool image.

More generally the invention is directed to a partial curing of a liquid photopolymer through its thickness with a desired pattern in its permanent substrate position to leave the outer surface tacky for further processing. The further processing may be typically a higher resolution photocure through the full layer thickness. Thus a liquid photopolymer layer in permanent place on its substrate is photocured through a selected opaque phototool pattern shape in two successive radiation steps, with differing areas imaged, the first radiation step producing an intermediate product condition and the second radiation step producing a permanent product condition. The second step, typically is one of high resolution obtained by contact printing of an image in surface contact with a tacky liquid state surface portion of the polymer layer.

Further objects features and advantages of the invention will be found throughout the following description, drawing and claims.

THE PREFERRED EMBODIMENTS

Figure 1:
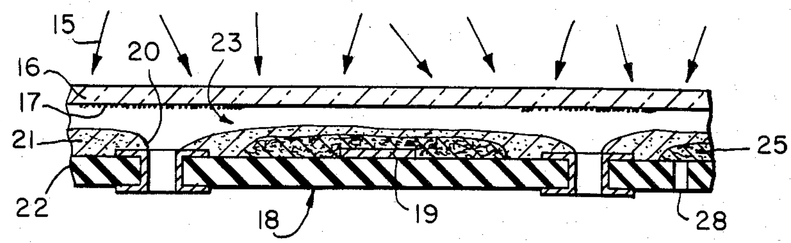
FIG. 1 is a fragmental section view of a printed wiring board and phototool in a first photoimaging process step using non-collimated radiation.

As may be seen from FIG. 1 non-collimated radiation, indicated by arrows 15, is directed through a phototool transparency 16 having opaque image forming patterns 17 thereon for selectively blocking out the radiation. For purposes of this invention non-collimated radiation is such radiation that significant energy is contained in rays that are non-parallel, thereby tending to cause reflections at interface surfaces and particularly air-to-plastic surfaces, which have enough misdirected energy to cause undesirable curing of the polymers.

The image pattern typically is used for photoimaging solder mask coatings on the printed wiring board 18 to cover wiring traces 19 and leave through hole connection pads 20 free to receive solder. A photopolymer layer 21 is superimposed over the surface of the wiring board 18, covering both the insulation panel substrate 22 surface and the wiring 19 and other surface irregularities superimposed thereupon. The lightly dotted stippling indicates the polymer in liquid paste consistency form and the heavy stippling the polymer in polymerized form as converted when subjected to radiation through the transparency 16.

Polymers as used in this invention may be either (1) those with free radical photo-initiators which react substantially instantly to radiation for polymerization, and thus are preferred for low energy fast response, or (2) cationic curing substances which gradually convert some ingredients to acids during radiation for acid curing of the remaining ingredients.

An air gap 23 is disposed between the phototool 16 and the surface of the polymer 21 by appropriate mounting of the substrate and the phototool. The properties of the liquid photopolymer selected cause its polymerization in response to radiation to be inhibited in the presence of air. Thus the radiation 15 passing through the transparent regions of the phototool 16 will polymerize the darkly stippled underneath portions 25 of the polymer layer disposed on the substrate surface and thus not exposed to air, while the surface exposed to air remains in liquid form. The radiation energy can be controlled to control the thickness of the liquid surface and the polymerized lower portion. The conductor trace 19 is thus covered with a hardened polymerized layer of the photopolymer. Typically, the conductor 19 extends about 0.001 inch from the substrate surface, the liquid polymer layer is about 0.003 inch thick and is polymerized about 0.002 inch to leave a liquid polymer depth of about 0.001 inch. This assures a minimum acceptable solder mask covering of at least 0.001 inch thickness. Otherwise had the phototool 16 been pressed, such as by squeegee action, into contact with the liquid polymer surface the thickness over the conductor would tend to be starved, particularly at the corners of the conductor trace 19, by being drawn into the gaps between the traces, etc. Other surface irregularities can cause the same effect.

The foregoing step gives very poor resolution for several reasons. The non-collimated radiation 15 with the air gap 23 will cause a spreading of the pattern from the desired area exactly under the transparent regions of the phototool image. Also reflections from the surface interfaces will cause noise that tends to disturb high resolution. reproduction, although it is significantly inhibited by the air surface exposure of the liquid polymer. In addition the phototool has oversized opaque regions 17, which do not correspond with the eventual desired high resolution pattern.

Note that this process is also particularly advantageous for tenting over holes 28 in the printed wiring board substrate. In the printed wiring board arts, particularly where solder mask coatings are desired, the hardened polymer surfaces inhibit about 85% of the surface area, leaving about 15% with the polymer removed, from those areas generally defined in negative type polymers by about 15% opaque constituency of a phototransparency image used in the radiating process step.

Figure 2:
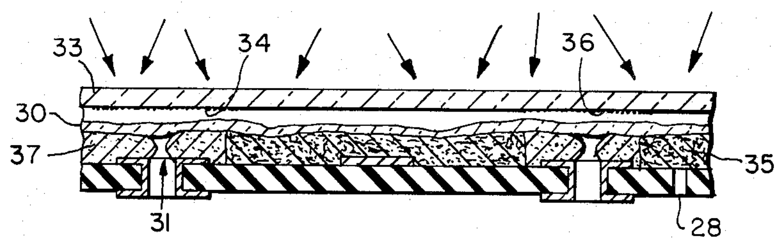
FIG. 2 is a fragmental section view of a printed wiring board and phototool in a second photoimaging process step using non-collimated radiation.

Accordingly the second radiation step as illustrated by FIG. 2 is provided by this invention starts with a significant portion of the polymer area cured. The printed wiring board 18 following the preceding exposure step of FIG. 1 is now overlaminated with a clear plastic thin film layer 30 by means of a squeegee or the like. This may tend to squeeze a little of the liquid form polymer into the through holes as at 31. However the broad base polymerized regions 25 of FIG. 1 support the squeegeeing step with little rearrangement of the liquid polymer state outer surface layer and certainly provides a further thickness of polymer over the conductor traces to be shielded and insulated in the solder bath process of solder mask coating embodiments.

The thin plastic film transparent layer 30 can serve as a phototool by having the final image pattern opaque regions carried thereby. However if this gives registration problems, a superimposed phototool 33 may be used wherein the opaque regions 34 are in close proximity with the liquid polymer surface in order to assure high resolution final reproduction. The surface may have some irregularities, exaggerated in the drawing, but since the air is excluded from the polymer surface it is more sensitive to radiation and the final polymerization step can take place with about the same radiated energy as before used to simplify equipment cost. Thus, this is a 'contact' printing step that gives high resolution faithfully reproducing the image borne by phototool 33.

Figure 3:
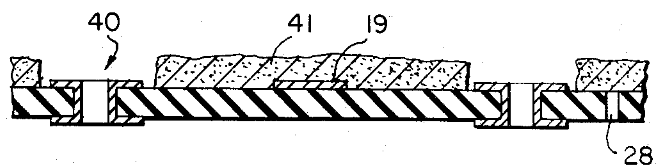
FIG. 3 is a fragmental section view of the printed wiring board product obtained from the process steps of FIGS. 1 and 2.

In this step the finally polymerized regions 35 are defined by the opaque image portions 36 of lesser area than those of FIG. 1. Thereby any poor resolution reproduction from the off contact printing step of FIG. 1 is simply covered to increase the extent of fully polymerized surface area and the unpolymerized liquid state polymer 37 remaining is simply washed out to form the solder pad regions 40 in the final product shown in FIG. 3. Therein the covering thickness of hardened polymer 41 over the conductor trace 19 is that obtained in FIG. 1 with the additional thickness, typically 0.001 inch, of the liquid layer, now polymerized.

Figure 4:
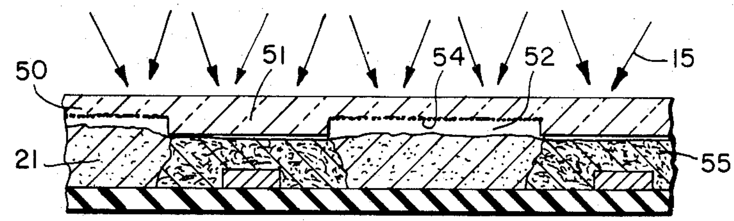
FIG. 4 is a fragmental section view of a printed wiring board and phototool radiated by non-collimated radiation in accordance with a second embodiment of the invention.

In the embodiment of FIG. 4, only a single radiation exposure step is required. Here again the resolution is increased by using the photopolymer property that polymerization is inhibited in the presence of air. There can be noise introduced for example by pinholes in the phototool image opaque regions, in addition to the reflections, etc. hereinbefore described when inexpensive non-collimated radiation is employed. In this embodiment to correct for this, a relief surface on the contact face of the phototool 50 is provided with the transparent regions 51 in contact with the liquid polymer 21 and an air gap S2 disposed between the opaque regions 54 and the surface of the polymer 21.

In this way the polymerized regions 55 result from the contact printing step due to the radiation 15, while the polymer remains in liquid state beneath the opaque regions 54. Because of the air gap 52 much greater radiation power would be needed to make the stray radiation from the noncollimated radiation source effective for polymerization causing noise. Thus high resolution photopatterning is effected with a single radiation step while improving that resolution obtainable with full contact of an entire phototool surface.

In particular this invention provides for the partial curing through the thickness of a liquid polymer layer in residence in permanent position on a substrate to leave a tacky liquid outer surface for further processing and a cured hard patterned underlying layer that may cover wiring patterns or irregular surfaces with a known thickness of cured and hardened polymer. This permits a first radiation step of controlled radiation energy to cure only from the desired depth down to the substrate. This is less critical when an air sensitive polymer is used with an air surface during exposure.

Excellent resolution may be obtained by contact printing on the tacky surface with a final photopattern after a first non-contact air interposed first printing step in an approximate or other preliminary pattern.

I claim:

1. The method of photoprinting the non-collimated radiation high resolution printed wiring board patterns on a liquid photopolymer layer of pastelike consistency over conductive surfaces disposed on a printed wiring board insulating substrate, comprising the steps of: (1) placing a phototransparency sheet having opaque and transparent patterns thereon defining a desired pattern image in substantially a parallel plane over said liquid photopolymer layer of a type having the property that the radiation required to cure it is greater when its surface is exposed to air for photoimaging a pattern upon the photopolymer layer by means of radiation from an uncollimated source passing through the phototransparency onto the photopolymer layer, (2) providing at the opaque photo pattern locations an air gap separation between the phototransparency sheet and the photopolymer layer to inhibit by the air surface the curing of the photopolymer areas defined by the opaque portions of the phototransparency in response to any stray radiation resulting from the use of an uncollimated radiation source, and, (3) photoexposing the photopolymer layer by passing uncollimated radiation of enough intensity to solidify only part of the liquid polymer layer adjacent the substrate and not exposed to air in response to the image by polymerization through the phototransparency sheet transparent patterns with the air gap separation providing an inhibition of the polymerization at the image positions on surface of the photopolymer layer exposed to air so that liquid polymer remains in surface positions defined by the opaque patterns of the phototransparency sheet.

2. The method of claim 1 including the step of providing the phototransparency with a surface in contact with the photopolymer only at the transparent portions of the image pattern with only the opaque portions of the image pattern having the air gap, thereby producing polymerization of the photopolymer layer portions defined by the transparent portions without polymerization of the photopolymer layer portions defined by the opaque portions of the phototransparency when radiated.

3. The method of photoprinting with non-collimated radiation high resolution printed wiring board patterns on a liquid photopolymer layer of pastelike consistency over conductive surfaces disposed on a printed wiring board insulating substrate, comprising the steps of: (1) placing a phototransparency sheet having opaque and transparent patterns thereon defining a desired pattern image in substantially a parallel plane over said liquid photopolymer layer of a type having the property that the radiation required to cure it is greater when its surface is exposed to air for photoimaging a pattern upon the photopolymer layer by means of radiation from an uncollimated source passing through the phototransparency onto the photopolymer layer, (2) providing at the opaque photo pattern locations an air gap separation between the phototransparency sheet and the photopolymer layer to inhibit by the air surface the curing of the photopolymer areas defined by the opaque portions of the phototransparency in response to any stray radiation resulting from the use of an uncollimated radiation source, and, (3) photoexposing the photopolymer layer by passing uncollimated radiation of enough intensity to solidify the liquid polymer layer selectively in response to the image by polymerization through the phototransparency sheet transparent patterns with the air gap separation providing an inhibition of the polymerization at the image positions on surface of the photopolymer layer exposed to air so that liquid polymer remains in surface positions defined by the opaque patterns of the phototransparency sheet, including the steps of placing said phototransparency sheet as a first photoimaging pattern over the photopolymer layer, radiating the photopolymer layer with only enough radiation energy to partially polymerize the layer at the portions adjacent the printed wiring board substrate and out of contact with the air gap to produce a liquid polymer outer surface adjacent the air gap, covering the liquid surface with a transparent layer in air free contact with the photopolymer layer with a second transparency having a photoimage pattern proportioned to that of the phototransparency sheet with reduced dimension opaque portions thereon registered within the areas of liquid photopolymer layer unpolymerized by said radiation step, and radiating non-collimated radiation through the second transparency with enough energy to polymerize through the entire photopolymer layer those portions defined by the transparency portions of the second transparency with high resolution.

4. The process of high resolution photoprinting with non-collimated radiation liquid photopolymers over irregular surface conductors extending from the surface of a printed wiring board with the liquid photopolymer of pastelike consistency of a substantial thickness layer and having properties requiring greater radiation energy to polymerize it when exposed to air, comprising the steps of: covering the conductors with a layer of the liquid photopolymer deposited on the wiring board surface, radiating with non-collimated radiation through an image pattern having opaque areas and an air gap between the polymer surface and the image pattern to expose the surface in air with enough radiation energy only to polymerize the portion of the polymer layer thickness on the board surface covering the conductors and in air free contact with the printed wiring board surface and leaving the outer surface of the polymer exposed to air in liquid form thereby to prevent non-collimated radiation passing through the air gap and impinging upon areas masked by the opaque areas from polymerizing unwanted areas of the photopolymer layer.

5. The process defined in claim 4 including the step of: overlaminating onto the liquid outer surface after said radiating step a thin clear plastic film thereby to permit polymerization of the liquid outer surface with less radiation energy in a second radiation step.

6. The process defined in claim 5 including the step of: photoexposing the photopolymer again through a phototransparency image having a pattern similar to said image pattern but proportioned to have opaque image patterns of similar dimensions, and said thin film with said amount of radiation energy to polymerize the liquid outer surface and produce patterns of hardened liquid polymer throughout the thickness of the polymer.

7. The process defined in claim 4 including the steps of providing an image in a second photoexposure step with a pattern similar to the original image but proportioned to have opaque image portions of smaller dimensions, and registering the opaque portions within the unpolymerized areas from the first radiation step thereby to sharply define unpolymerized areas remaining after the second photoexposure step.

8. The product obtained by the process of claim 4.

9. The process of claim 4 wherein the conductors extend approximately 0.001 inch from the surface of the printed wiring board, the layer of photopolymer is about 0.003 inch thick and the radiation step polymerizes the polymer to a thickness of about 0.002 inch to cover the conductors.

10. The product obtained by the process of claim 9.

11. The method of photopatterning an image on a liquid photocuring layer disposed on a printed circuit wiring board substrate wherein the layer is a liquid photopolymer of the type where a curing step with limited radiation intensity leaves a liquid photopolymer surface layer, and comprising the steps of:

providing a radiation energy source of an intensity for curing said liquid photopolymer layer through a portion of its thickness where not exposed to air but leaving the surface layer in liquid polymer form, interspersing a phototool carrying a transparent photo image having opaque areas between the radiation source and the liquid photopolymer layer for defining a pattern desired thereon with a gap separating the photo image from the liquid layer, partially curing the layer through said portion of its thickness by radiation from said source passing through the photo image to form a pattern of partially cured and liquid photopolymer corresponding to the transparent photo image without any substantial curing of portions of the liquid photopolymer layer that corresponds to the opaque areas of the photo image, laminating a thin transparent film onto the liquid surface of the partially cured photopolymer layer after the partially curing step, exposing the partly cured layer to a second radiation step through a similar photo image pattern proportioned to have smaller opaque pattern areas thereby to further cure the layer, removing the thin film, and removing the photopolymer remaining in the liquid state to produce a photopatterned photopolymer layer on said printed wiring board substrate.

12. The method defined in claim 11 wherein the opaque pattern shapes encompass no more than about 15% of the photopolymer surface area.

* * * * *